United States Patent [19]
Beddingfield et al.

[11] Patent Number: 5,710,071
[45] Date of Patent: Jan. 20, 1998

[54] PROCESS FOR UNDERFILLING A FLIP-CHIP SEMICONDUCTOR DEVICE

[75] Inventors: Stanley C. Beddingfield; Leo M. Higgins, III; John C. Gentile, all of Austin, Tex.

[73] Assignee: Motorola, Inc., Schaumburg, Ill.

[21] Appl. No.: 566,754

[22] Filed: Dec. 4, 1995

[51] Int. Cl.$^6$ .................................. H01L 21/60
[52] U.S. Cl. .................. 438/108; 438/127; 438/126; 257/778
[58] Field of Search .................. 437/211, 215; 257/777, 783, 778, 782; 438/108, 126, 127

[56] References Cited

U.S. PATENT DOCUMENTS

| | | | |
|---|---|---|---|
| 4,604,644 | 8/1986 | Beckham et al. | 437/211 |
| 5,144,747 | 9/1992 | Eichelberger | 29/839 |
| 5,182,632 | 1/1993 | Bechtel et al. | 257/713 |
| 5,203,076 | 4/1993 | Banerji et al. | 29/840 |
| 5,218,234 | 6/1993 | Thompson et al. | 257/787 |
| 5,296,738 | 3/1994 | Freyman et al. | 257/684 |
| 5,311,059 | 5/1994 | Banerji et al. | 257/778 |
| 5,385,869 | 1/1995 | Liu et al. | 437/209 |
| 5,473,512 | 12/1995 | Degani et al. | 361/760 |
| 5,488,200 | 1/1996 | Tsukada | 174/261 |
| 5,594,626 | 1/1997 | Rostoker et al. | 257/787 |

FOREIGN PATENT DOCUMENTS

| | | | |
|---|---|---|---|
| 53-139468 | 12/1978 | Japan | 437/211 |
| 59-143333 | 8/1984 | Japan | 437/211 |

OTHER PUBLICATIONS

A.J. Babiarz, et al.; "Process Notes for Successful Encapsulation and Underfilling in MCM Assembly;" Electronic Packaging & Production; pp. 20–22 (Nov. 1994).

C.E. Park et al.; "Evaulation of Epoxy Underfill Materials for Use in Chip–on–Board Method of Packaging Silicon Integrated Circuits;" Annual Technical Conf. Proceedings; pp. 2871–2876, (1995).

C.E. Bouras; "Adhesive Dispensing for Flip Chip–on–Board;" Electronic Packaging & Production; pp. S9–S11, (Oct. 1995).

Clementi et al., "Flip–Chip Encapsulation On Ceramic Substrates", 1993 Proceedings, 43rd Electronic Components and Technology Conference, IEEE, New York, NY, pp. 175–181 Jun. 1, 1993.

Suryanarayana et al., "Encapsulants Used in Flip–Chip Packages", 1993 Proceedings, 43rd Electronic Components and Technology Conference, IEEE, New York, NY, pp. 175–181 Jun. 1, 1993.

Park et al., "Evaluation of Epoxy Underfill Materials for Use in 'Chip–on–Board Method of Packaging Silicon Integrated Circuits", Annual Tech. Conf. Proceedings, pp. 2871–2876 1995.

*Primary Examiner*—John Niebling
*Assistant Examiner*—Kevin F. Turner

[57] ABSTRACT

A flip-chip semiconductor device (70) is formed by mounting a semiconductor die (20) to a wiring substrate (30). The wiring substrate includes a hole (39). An underfill encapsulation material (52) is dispensed around an entire perimeter of the semiconductor die. The underfill encapsulation material then flows toward the center of the die, expelling any trapped air through hole (39) of the wiring substrate to avoid voiding. By providing a method which utilizes an entire perimeter dispense, manufacturing time of the underfilling step is significantly reduced. At the same time, a uniform fillet is formed and the formation of voids in the underfill encapsulation material is avoided due to the presence of hole (39) in the wiring substrate. Multiple die (100) can also be underfilled using a single dispensing operation in accordance with the invention.

17 Claims, 5 Drawing Sheets

PROCESS FOR UNDERFILLING A FLIP-CHIP SEMICONDUCTOR DEVICE

FIELD OF THE INVENTION

The present invention relates to flip-chip semiconductor devices in general, and more specifically to methods for underfilling such devices.

BACKGROUND OF THE INVENTION

Flip-chip semiconductor devices are finding more widespread use in the electronics industry since flip-chip mounting permits a higher component density and faster accessing times in systems than if conventionally packaged semiconductor devices are used. A flip-chip semiconductor device is one in which a semiconductor die is directly mounted to a wiring substrate, such as a ceramic or an organic printed circuit board. Conductive terminals on the semiconductor die, usually in the form of solder bumps, are directly physically and electrically connected to the wiring pattern on the substrate without use of wire bonds, tape-automated bonding (TAB), or the like. Because the conductive bumps making connections to the substrate are on the active surface of the die or chip, the die is mounted in a face-down manner, thus the name flip-chip.

One problem in flip-chip mounting a semiconductor die is that the coefficient of thermal expansion (CTE) of the die and that of the substrate are usually quite mismatched. For example, silicon has a CTE of about 3 parts per million per degree Celsius (ppm/° C.) while the CTE of an organic substrate is about 16 ppm/° C. and that of a ceramic substrate is about 6.5 ppm/° C. Thus upon thermal excursions which the die experiences during normal operating, the solder bumps which couple the die to the substrate experience significant stresses, leading to thermal fatigue and connection failures. A method of overcoming the thermal mismatch between the die and the substrate is to include an under fill encapsulation material between the die and the substrate which embeds the solder balls within the underfill encapsulation material. The underfill encapsulation material mechanically couples the chip and the substrate, and decreases the stress in the solder joints to improve device lifetime.

While the use of an under fill encapsulation material is recognized as an improvement to flip-chip semiconductor devices from a reliability perspective, use of under fill encapsulation materials pose problems from a manufacturing perspective. One problem is the ability to underfill the die without creating voids in the underfill encapsulation material beneath the die. If voiding occurs, any solder bumps which exist in the voided area are subject to thermal fatigue as if the underfill encapsulation material were not present. Preventing voids in the underfill encapsulation material is governed by the material characteristics, such as rheology, viscosity, and filler content of the material. These characteristics are determined by the manufacturer of the underfill encapsulation material. But one who uses the material also influences the extent of voiding, for instance by the manner in which the material is dispensed. If the under fill encapsulation material were dispensed around all four sides of the semiconductor die at one time or within a quick time span, air would be trapped beneath the die and the substrate with no where to escape, thus leaving a void.

Current practices to prevent voiding of the under fill encapsulation material utilize a one sided or two-sided dispense process. The underfill encapsulation material is dispensed along only one side or two adjacent sides of the semiconductor die. The underfill encapsulation material is then allowed to freely flow, as a result of capillary forces, beneath the semiconductor die, and exiting on the remaining sides. In using the one-sided or two-sided dispense, the under fill encapsulation material is able to push any air which exists in a space between the die and the substrate out from the opposing sides of the die as the material fills the space. An example of such a current two-sided dispense practice is represented in FIG. 1, which is a simplified top view of a semiconductor die 2, a substrate 4, and an under fill encapsulation material 6 dispensed along only two sides of the die. After dispensing the underfill encapsulation material, the material flows to the opposing sides and corner of the die, as the arrows of FIG. 1 indicate.

While current practices of a one-sided or two-sided dispense reduce the likelihood of having voids form in the underfill encapsulation material, the practice consumes a large amount of manufacturing time. Upon dispensing the underfill encapsulation material, one must wait for a sufficient amount of time for the material to completely fill the space between the die and the substrate. As die sizes increase, and as the number of solder bumps used to connect the die to the substrate increases, the time required to allow the underfill encapsulation material to completely fill the space beneath the die becomes quite long. As an example, underfilling a 620 mil (15.75 millimeter (mm))×550 mil (13.97 mm) die sample having about 675 solder bumps using a two-sided dispense procedure which dispensed a volume of approximately 25 mm$^3$ took over 12 minutes to completely fill the space beneath the die sample and the substrate. (The underfill encapsulation material used was Dexter Hysol's FP4510, which has the following properties: specific gravity of 1.7; 67% filler content; viscosity of 10,000 centipoise (100 grams per centimeter second) at 25° C. as measured with a C52 spindle by Brookfield at a speed of 20 revolutions per minute.)

A further disadvantage of the traditional one-sided and two-sided dispense sequences is that the fillet which is created by the process is non-uniform around the die. Typically, the fillet will be larger along the one or two sides where the underfill encapsulation material was dispensed. Since the fillet along the remaining sides of the die (where the material was not dispensed) is too small, and the manufacturer usually requires a uniform fillet, an additional four-sided dispense is required to correct the fillet profile. The additional dispensing operation not only further increases manufacturing time, but also requires additional material, further increasing device cost.

In today's manufacturing environment where cycle time is a crucial component of a manufacturer's success, dispense cycles beyond more than a few minutes are unacceptable. Likewise, any processing steps which impose unnecessary material costs are encouraged to be eliminated. Accordingly, a need exists for an improved under fill encapsulation material dispense process which can be performed quicker than the current practices while at the same time avoiding void formation and keeping material costs low.

DETAILED DESCRIPTION OF A PREFERRED EMBODIMENT

Figure 1:
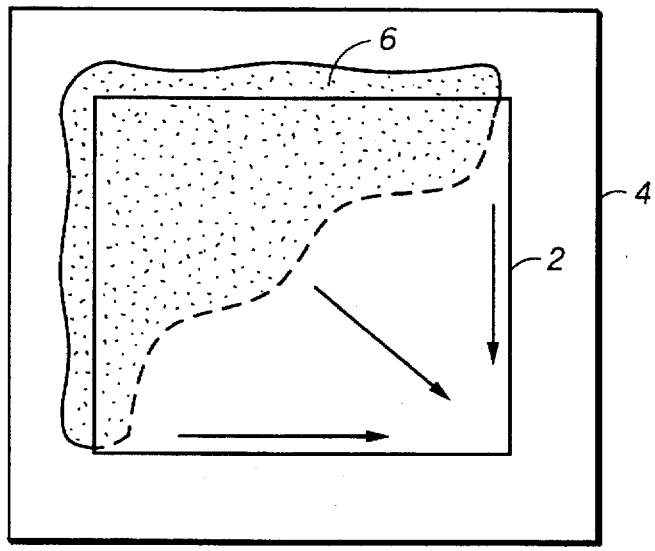
FIG. 1 is a top-down view of a semiconductor die and a substrate as an under fill encapsulation material flows following a two-sided dispense process known in the prior art.

Generally, the present invention provides for a method for dispensing an underfill encapsulation material between a flip-chip mounted semiconductor die and a wiring substrate which can be performed quickly and without the formation of voids in the underfill encapsulation material. The process is performed quickly because the underfill encapsulation material is dispensed around all four sides of a semiconductor die. Void formation is prevented due to the presence of a hole provided in the wiring substrate, usually formed near the center of the die, through which air escapes during ingression of the underfill encapsulation material. Upon dispensing the underfill encapsulation material around all four sides or a perimeter of the semiconductor die, the material will flow towards the center of the die. Any air that exists in a gap between the die and wiring substrate is expelled through the hole as the under fill encapsulation material approaches the hole. The presence of the hole also helps to reduce manufacturing time for the underfill encapsulation material process, as it helps the material flow more quickly toward the hole and beneath the die. The time it takes for the underfill encapsulation material to flow completely beneath the die can further be reduced by providing a low pressure area, such as a venturi vacuum, at the bottom of the substrate near the opening to pull the underfill encapsulation material more quickly toward the hole. Because the underfill encapsulation material also at least partially fills or covers the hole in the substrate upon completion of the dispense process, there is no reliability concern in having a hole in the substrate.

These and other features and advantages of the present invention will be more clearly understood from the following detailed description taken in conjunction with the accompanying drawings. It is important to point out that the illustrations are not necessarily drawn to scale, and that there can be other embodiments of the invention which are not specifically illustrated. Further, it is noted that like reference numerals are sometimes used throughout the various views to denote identical or similar elements.

Figure 2:
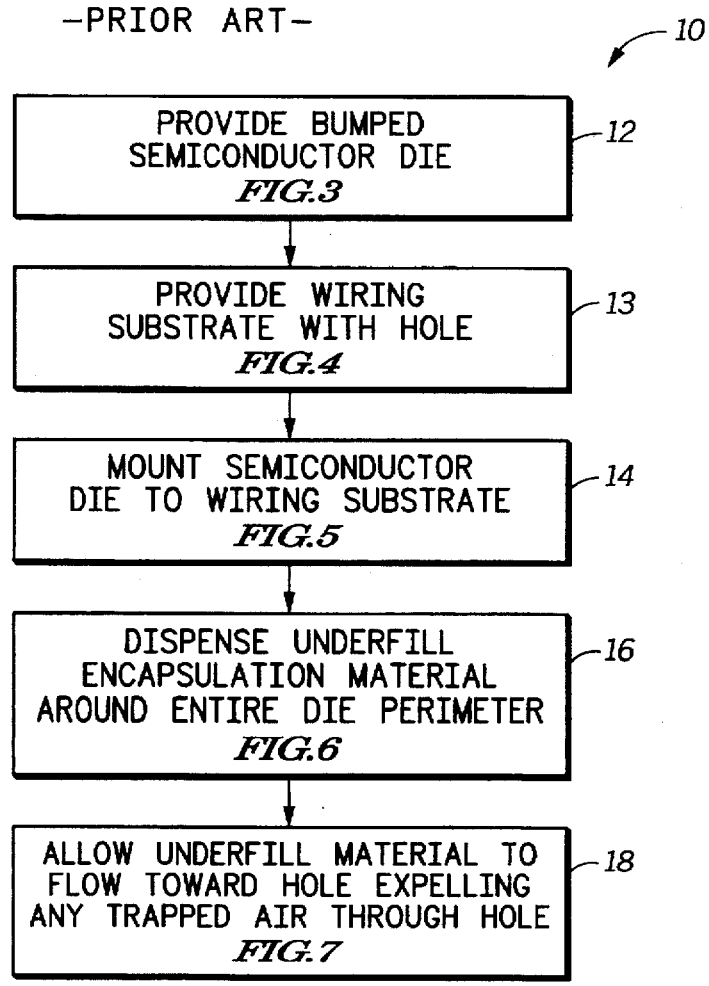
FIG. 2 is a process flow illustrating the steps for underfilling a flip-chip semiconductor device in accordance with the present invention.

Illustrated in FIG. 2 is a process flow 10 which is representative of processes for underfilling a semiconductor die in accordance with the present invention. At each of the steps illustrated in process flow 10, it is useful for the reader to refer to the cross-sectional illustrations depicting the process flow as illustrated in FIGS. 3–8.

Figure 3:
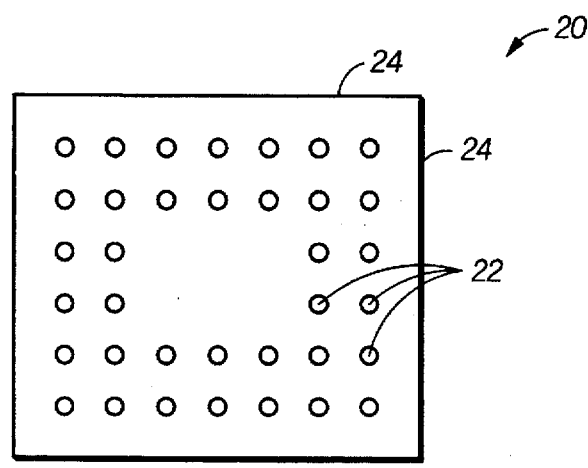
FIG. 3 is a top-down view of an active surface of a semiconductor die having a plurality of conductive bumps formed thereon.

Process flow 10 begins with a providing step 12, wherein a bumped semiconductor die is provided. An example of such a semiconductor die 20 is illustrated from a top-down view in FIG. 3. The major surface of die 20 illustrated in FIG. 3 is the top or active surface of the die (e.g. the surface on which integrated circuitry has been formed). On the active surface, die 20 includes a plurality of conductive bumps 22. Die 20 also includes a perimeter 24, which as illustrated in FIG. 3 is composed of all sides of a quadrangular die.

In practicing the present invention, the functionality or type of semiconductor die used is unimportant. For example, the die can be a memory, a microprocessor, an analog device, an application specific device, or the like. In addition, the particular shape of perimeter 24 is not important for the purpose of practicing the invention. The present invention can be practiced with hexagon die, triangular die, etc. Likewise, for purposes of practicing the present invention, the manner in which conductive bumps 22 are formed, and the materials from which they are formed, are not restricted by this invention. In a preferred form of the present invention, conductive bumps 22 are formed as solder bumps. Conventional methods for forming solder bumps can be used to form conductive bumps 22. One method is to selectively deposit metal on the active surface of the die (for instance deposition through a shadow mask), followed by a reflow operation which establishes the final bump composition and spherical shape. In the industry, this method is sometimes referred to as C4 (Controlled Collapse Chip Connection) bump processing.

Figure 4:
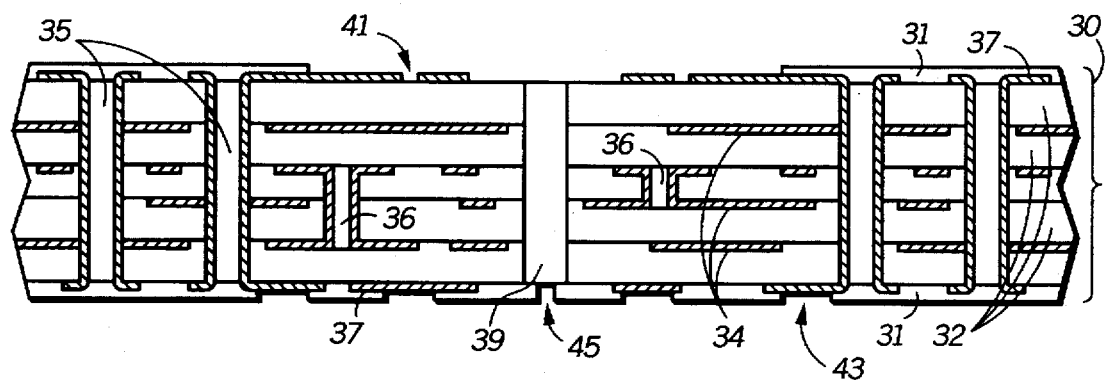
FIG. 4 is a cross-sectional view of a wiring substrate suitable for use in practicing the present invention.

Another providing step 13 is included in process flow 10, specifically the step of providing a wiring substrate having a hole. FIG. 4 illustrates one suitable wiring substrate 30 in a cross-sectional view. As illustrated in FIG. 4, wiring substrate 30 includes a plurality of dielectric or insulating layers 32 and a plurality of internal conductive layers 34 which are laminated or co-fired between the various insulating layers. In two specific embodiments of the present invention, wiring substrate 30 can either be in the form of an organic substrate or a ceramic substrate. In an organic substrate, the bulk material of the dielectric or insulating layers is likely to be a resin, such as bismaleimide triazine (BT) resin. Also in the case of an organic substrate, internal conductive layers 34 are likely to be a copper material which has been laminated on an insulating layer, and subsequently patterned and etched to form the desired conductive pattern. Multiple dielectric layers having conductive layers laminated thereon are then pressed together to form a composite, multilayer wiring substrate, such as that illustrated in FIG. 4. In the case of the ceramic substrate, the dielectric material to form insulating layers 32 will be some sort of ceramic material such as alumina, or a glass ceramic. The internal conductive layers 34 of a ceramic wiring substrate are likely to be copper, tungsten or molybdenum, formed by screen printing metal pastes in the desired pattern. As with an organic substrate, individual dielectric layers are laminated together to form a multilayer ceramic substrate. A subsequent firing operation at about 800°–1600° C. is performed to densify the ceramic and make the metal pastes conductive.

Whether wiring substrate 30 is formed of an organic or ceramic material, the substrate is likely to include a variety of vias used to establish electrical routing of the various conductive layers in and through the substrate. As illustrated in FIG. 4, wiring substrate 30 includes through-vias 35 and blind vias 36. Through-vias are conductive vias which extend completely through the entire cross-section of the substrate (i.e. extend from the top surface of the substrate through to the bottom of the surface of the substrate). Blind vias, on the other hand, are vias which connect only internal conductive layers within the substrate. Blind vias are so called because they cannot be discerned from a visual inspection of a finished substrate. A common feature to both through-vias 35 and blind vias 36 is that both via types are conductive vias. In organic substrates, conductivity is usually established by a plated conductive layer which lines the walls of the vias, as illustrated in FIG. 4. In view of this fact, the vias are sometimes referred to as plated through-holes (PTHs). In ceramic substrates, the vias are filled with the metal pastes that are screen printed on the various ceramic layers to form conductive traces. Thus in ceramic substrates, the vias are usually filled.

Wiring substrate 30 also includes external conductive layers 37 which exist on the top and bottom surfaces of the substrate, as illustrated in FIG. 4. External conductive layers 37 are patterned using processing techniques similar to those used to define internal conductive layers 34. As will become apparent in subsequent figures, external conductive layer 37 which is formed on top of wiring substrate 30 is used for routing the electrical signals from a semiconductor die to appropriate conductive vias and conductive layers within the substrate, and eventually to the external conductive layer 37 on the bottom of the wiring substrate. External conductive layers 37 will likely be patterned into a plurality of conductive traces and pads. Pads on the top surface of the substrate correspond in configuration to the bump configuration of the die which is to be attached to the substrate. Pads on the bottom surface of the substrate correspond in configuration to a user's board requirements. User terminals in the form of solder balls, solder columns, pins, or the like, are used to connect the pads on the bottom of wiring substrate 30 to the user's board.

As illustrated in FIG. 4, wiring substrate 30 also includes a solder mask 31 on the top and bottom surfaces of the substrate, selectively covering external conductive layers 37. Solder masks are typically included on organic substrates, and not included on ceramic substrates. On the top surface, solder mask 31 includes an opening 41 for receiving a semiconductor die. Since the solder mask is made of an insulating material, portions of the wiring substrate which make electrical contact to the die must be exposed. Rather than forming a die opening in the solder mask as illustrated, the mask can be patterned to expose individual pads on the external conductive layer where bumps on the die will be connected. On the bottom surface, the solder mask is patterned to expose those portions of the external conductive layer 37 where user terminals (e.g. solder balls or pins) will be connected. As illustrated, solder mask 31 includes a plurality of openings 43 for this purpose.

As thus far described, wiring substrate 30 is formed in accordance with conventional substrate manufacturing techniques. The materials of the solder mask 31, insulating layers 32, internal conductive layers 34, and external conductive layers 37, the manner in which through holes or vias are formed, and the manner in which the conductive layers are patterned, are practices all known in the art of substrate manufacturing. Accordingly, additional description is omitted.

The present invention utilizes an additional feature to otherwise conventional wiring substrates to facilitate the process of underfilling a flip-chip semiconductor die. Specifically, as illustrated in FIG. 4, wiring substrate 30 includes a hole 39 which extends from a top surface of the substrate through to a bottom surface of the substrate. The purpose of providing hole 39 in wiring substrate 30 is to facilitate the flow of an underfill encapsulation material beneath the semiconductor die, as will subsequently become apparent. Hole 39 can be formed in the same way in which vias are formed throughout the substrate. For example, in an organic substrate, hole 39 can be formed through a drilling operation. In a ceramic substrate, hole 39 can be formed by punching in the same process step where vias 35 and 36 are punched. As indicated in FIG. 4, one difference between hole 39 as formed through the substrate and the vias which are formed in the substrate is that there is no need for hole 39 to be plated or filled with a conductive material. For purposes of the present invention, hole 39 provides no electrical function, therefore electrical conductivity is not necessary. Furthermore, if hole 39 were filled at the time an underfill encapsulation material is dispensed, its functionality would be destroyed. Similarly, if a solder mask is utilized, the mask should not cover hole 39 at the top of the wiring substrate (i.e. under the die). On the bottom, if a mask is present it should contain an opening 45 aligned to hole 39 in the substrate. The size of opening 45 in the solder mask can either be larger or smaller than the opening in the wiring substrate, as further explained below.

In general, the diameter of hole 39 should be 5-30 mils (0.13-0.76 mm), and more desirably between 5-15 mils (0.13-0.38 mm). In choosing an appropriate hole size to facilitate this purpose, the following should be considered. Hole diameter by punching or drilling is typically limited by substrate thickness or hole aspect ratio. A thinner substrate therefore allows for a smaller hole. Non-standard processing, e.g. laser hole drilling, can also enable smaller holes in a substrate. The maximum hole diameter is limited by the fact that a larger hole eliminates a larger area for possible circuit routing in the substrate. Thus, too large of a hole area can force the use of a higher cost (higher layer count) substrate. Also, it is desired for an underfill encapsulation material to coat the entire die surface, including the portion of the die directly overlying hole 39, after dispensing. If the diameter of hole 39 is too large, the material will not coat the die surface overlying the hole. The maximum size at which the under fill encapsulation material fails to coat the entire die face opposing the hole 39 is dependent upon the rheology of the underfill encapsulation material and the surface energy and roughness of the die face. An approximate maximum hole diameter is about 1 mm.

As thus far described, hole 39 has presumably been round (thus reference to a "diameter" of the hole). However, other shapes of openings in the substrate can serve the same purpose. Circular holes are likely to be attractive because they are easily incorporated into the existing substrate manufacturers' punching and drilling processes. But square, rectangular, or other geometric shapes can be used. In using non-circular openings in the substrate, the dimensions of the openings are more difficult to estimate since the shape of the hole can vary. As a general rule, however, the width of an opening used for assisting flow of an under fill encapsulation material should be kept at or under 2 mm.

Figure 5:
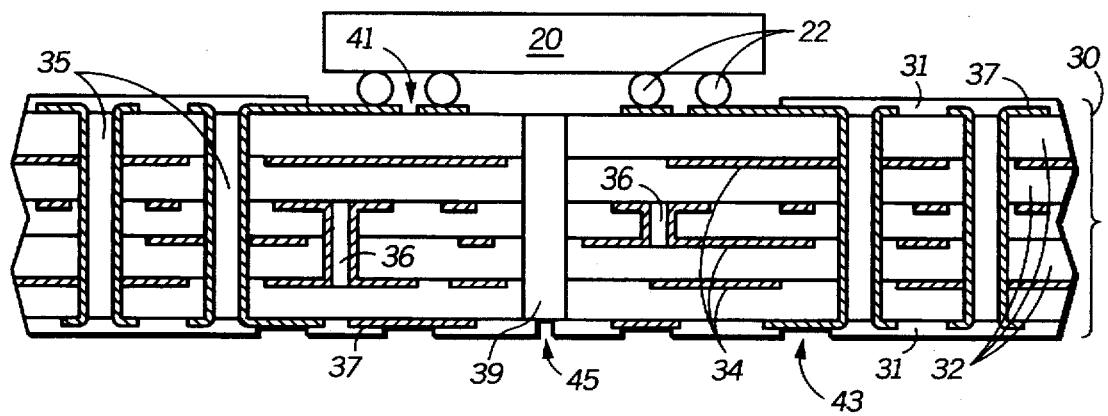
FIG. 5 is a cross-sectional view of the wiring substrate of FIG. 4 with the semiconductor die illustrated in FIG. 3 mounted thereon in a flip-chip configuration.

Continuing with FIG. 2, after the semiconductor die and wiring substrate have been provided (the order of which is not important), the semiconductor die is mounted to the wiring substrate in a mounting step 14. Bumped semiconductor die 20 is mounted to wiring substrate 30, as illustrated in cross-section in FIG. 5. As illustrated in FIG. 5, die 20 is mounted in a flip-chip configuration, wherein the active surface having conductive bumps 22 formed thereon is mounted to be adjacent to the top surface of the substrate. Semiconductor die 20 is mounted so that the configuration or pattern of conductive bumps 22 matches the configuration or pattern of the pads or traces of the external conductive layer on the top surface of the wiring substrate. After placement of the die on the wiring substrate in the case of C4-type bump formation and processing, both the die and the substrate undergo a thermal operation to reflow the conductive bump metallurgy to the external conductive layer on the top of the wiring substrate. Upon reflowing, both a physical and an electrical connection is made between the die and the substrate. It is noted that the precise manner in which the die is mounted to the substrate will depend upon the type of conductive bumps formed on the die surface. While the forgoing mounting process was described in reference to a C4-type bumping process, any die-to-substrate mounting techniques for flip-chip can be used in practicing the present invention.

As illustrated in FIG. 5 and in accordance with an embodiment of the present invention, semiconductor die 20 is mounted on the wiring substrate such that hole 39 is located at or near the center of the semiconductor die. This is particularly important when wiring substrate 30 includes only one such hole 39. But as will become apparent in subsequent figures, having the openings positioned precisely in the center of the die becomes less important depending upon the perimeter shape of the die, and the flow characteristics of the underfill encapsulation material after dispensing around the die perimeter. However, for the purpose of this first example, wiring substrate 30 includes but one hole 39, that being located near the center of die 20.

Figure 6:
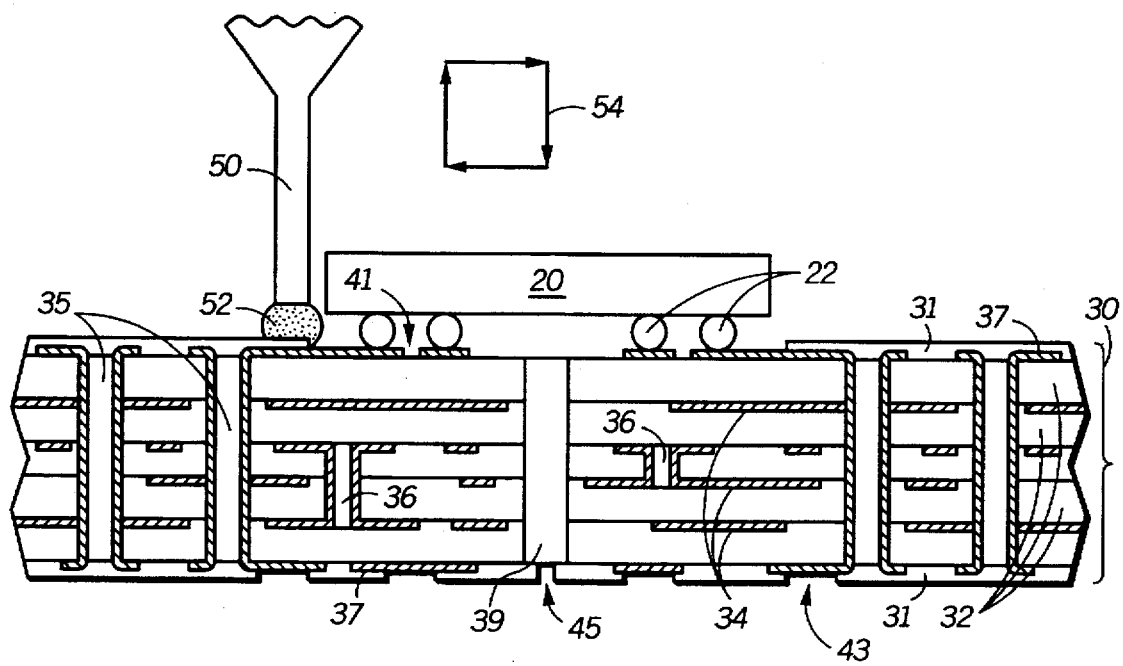
FIG. 6 is a cross-sectional illustration indicating how an underfill encapsulation material is dispensed to fill a space between the die and wiring substrate illustrated in FIG. 5.

After having mounted the die to the wiring substrate, the next step in process flow 10 is a dispensing step 16 wherein an underfill encapsulation material is dispensed around the entire die perimeter. As illustrated in FIG. 6, a dispensing needle 50 is used to dispense an underfill encapsulation material 52 around the entire perimeter of die 20. Any of the commercially available materials sold for underfill applications can be used in conjunction with the present invention. Likewise, commercially available dispensing equipment can be used in practicing the invention. As die 20 is a quadrangular die, the pattern which dispensing needle 50 follows is likewise a quadrangular shape, as illustrated in FIG. 6 as a dispensing pattern 54. (It is noted that the dispensing pattern 54 as illustrated is the pattern which dispensing needle 50 follows in a plane parallel to the top surface of wiring substrate 30.)

In contrast to prior art dispensing techniques for underfill encapsulation materials, the present invention dispenses the underfill encapsulation material around the entire perimeter of the die. In prior art techniques, dispensing around the entire die perimeter led to a problem of voiding in the underfill material. The reason for the voiding in prior art techniques was that air existing between the semiconductor die and the top surface of the wiring substrate was trapped if an underfill dispense material was dispensed around all sides of the die. Upon dispensing an underfill encapsulation material around all sides of a semiconductor die, the material would flow towards the center of the die, but the air between the die and the substrate would have no means of escaping. Prior art solutions for avoiding this trapped air involved dispensing an underfill encapsulation material along only one or two sides of a quadrangular die. Upon allowing the underfill encapsulation material to flow beneath the die, the under fill encapsulation material could expel air from beneath the die by forcing air out of the opposing sides of the die perimeter. As discussed earlier, however, one-sided or two-sided dispensing techniques have a significant manufacturing disadvantage, that being a long cycle time to complete the dispensing and underfilling operation. Upon dispensing the material along one side or two sides of a semiconductor die, the manufacturer is relying upon the natural flow characteristics of the material beneath the die, waiting until the under fill encapsulation material has a chance to completely fill the area between the die and substrate. Depending upon the size of the die, this waiting period could last as long as 12 minutes or more. A further disadvantage of one and two-sided dispense techniques of the prior art is that the fillet of the underfill encapsulation material is non-uniform around the die perimeter, typically being greater along the sides where dispensed. An uneven fillet is not only a cosmetic concern, but also a reliability concern.

Figure 7:
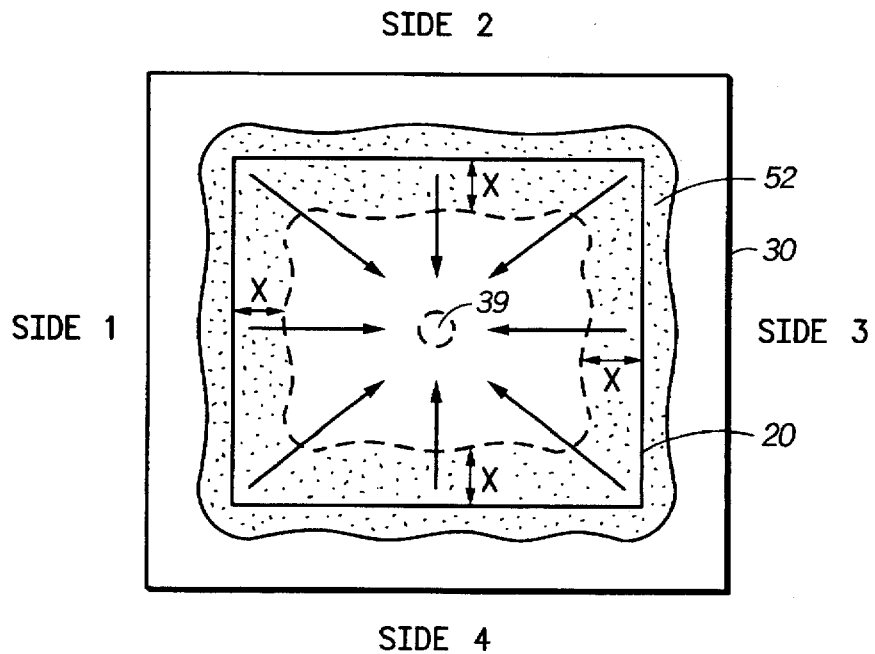
FIG. 7 is a top-down view of the semiconductor die and the wiring substrate after the under fill encapsulation material has been dispensed, illustrating the directional flow of the underfill encapsulation material.

In accordance with the present invention, manufacturing cycle time is significantly reduced and fillet uniformity is achieved by enabling an underfill encapsulation material to be dispensed around the entire perimeter of the die. Yet in practicing the present invention, a manufacturer will not experience the voiding problems associated with trapped air due to the presence of hole 39 in wiring substrate 30. After the underfill encapsulation material 52 is dispensed about the die perimeter, the material is allowed to flow freely beneath the die to completely fill the space between the die and the wiring substrate. In process flow 10 of FIG. 1, this step is included as an allowing step 18. FIG. 7, which is a top-down view of die 20 as it is mounted on wiring substrate 30, illustrates how the material will flow toward the center of the die, and toward hole 39, after being dispensed as a result of capillary action. The arrows in FIG. 7 represent the directional flow of the underfill encapsulation material upon dispensing about the entire perimeter of the die.

In dispensing underfill encapsulation material 52, it is preferred that the material approach any holes in the substrate uniformly from all sides of the die. For example, in reference to FIG. 7, the flow distance of underfill encapsulation material 52 (X) should be approximately the same around each of Sides 1–4 of the die as illustrated. Quantitatively, one could say that the center of the hole 39 can deviate from the center of the die placement area in the X and/or Y direction by approximately 25 percent of the length of the associated X and/or Y die edge. Equal or uniform flow distances around the die perimeter are particularly important when utilizing one hole in the wiring substrate which is centrally located with respect to the die. In order to achieve this uniform flow distance of the underfill encapsulation material, dispensing of the material must be performed rather quickly. If dispensing of the material occurs too slowly, the first side along which the under fill encapsulation material is dispensed will have an opportunity to flow a greater distance toward the hole than the last side along which the underfill encapsulation material is dispensed. In such a situation, the underfill encapsulation material will reach the opening from the first side before the underfill encapsulation material from the last side reaches the opening. As a result, the underfill encapsulation material which is dispensed along the first side of the die can flow beyond the hole, thereby blocking the path for trapped air to escape and causing voids in the under fill encapsulation material. While precise dispensing times cannot be stated with certainty since the flow distances of an underfill encapsulation material will depend upon the material used, the volume of material dispensed, and the die dimensions, as a general rule one can anticipate that a dispensing time of between 0.30 to 0.60 second per mm of die perimeter, and more preferably between 0.05 to 0.30 second per mm of die perimeter should be implemented.

Figure 8:
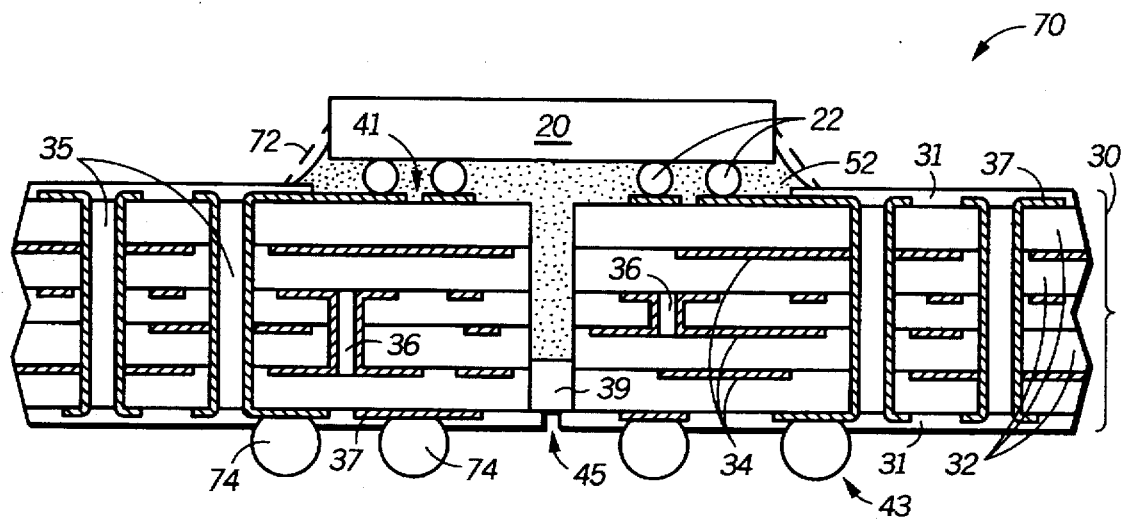
FIG. 8 is a cross-sectional illustration of the semiconductor die and the wiring substrate after the underfill encapsulation material has completely filled a space between the die and the wiring substrate.

After dispensing the underfill encapsulation material, and after allowing the material to completely underfill the space between the semiconductor die and the wiring substrate, the flip-chip semiconductor device will look similar to a semiconductor device 70 illustrated in a cross-sectional view in FIG. 8. As illustrated, underfill encapsulation material 52 completely fills the space between semiconductor die 20 and the top surface of the wiring substrate 30. Also as illustrated, it is possible, and even probable, that underfill encapsulation material will at least partially fill hole 39 of the wiring substrate. It is preferred that the material at least partially fill the hole in order to protect the die from moisture and contamination during subsequent processing (e.g. application of flux) and subsequent handling. To assure that the underfill encapsulation material 52 is contained within hole 39 without escaping to the backside of the substrate, solder mask 31 can include opening 45 which is smaller than hole 39. By making opening 45 smaller, the solder mask partially occludes hole 39, helping to prevent underfill encapsulation material 52 from escaping from hole 39 while at the same time permitting trapped air to be vented during the underfill process. An advantage of leaving hole 39 untilled with underfill encapsulation material 52 is that an untilled hole would potentially allow moisture off-gassing for popcorn resistance in plastic encapsulated devices. However, the extent of popcorn resistance would be highly dependent on material properties and die size.

After under filling the die, manufacturing of device 70 proceeds as usual. For instance, a plurality of solder balls 74 are attached to the bottom of the substrate (within openings 43 of the solder mask 31 on the bottom of the substrate) as shown in FIG. 8. Solder balls serve as user terminals for subsequent connection of the device to a user's board. Other type of terminals can be included in the device, e.g. conductive pins. Lids and heat spreaders can also be included in the device after the underfill process.

A comparison of the present invention to the prior art two-sided dispense process reveals over a 4X reduction in cycle time for the underfill process. As noted earlier in the background, underfilling a 620 mil (15.75 mm)×550 mil (13.97 mm) die sample having about 675 solder bumps using a two-sided dispense procedure which dispensed a volume of approximately 25 mm³ took over 12 minutes to completely fill the space beneath the die sample and the substrate. Using the same die sample, the same underfill encapsulation material, the same dispensed volume, and the same wiring substrate except for the addition of a 30 mil (0.76 mm) hole located near the center of the die, the underfill process took only 2.5 minutes to completely fill the space between the die and wiring substrate after dispensing the material around all four sides of the die. Other processing conditions used in demonstrating the benefits of the invention are as follows: needle size-25 gauge; gauge pressure-40 pounds per square inch (2.81 kilograms per square centimeter); needle speed- 0.20 inches (5.08 mm) per second; vacuum-none; substrate temperature-80° C.

Although the fillet of underfill encapsulation material 52 will be uniform around the die perimeter since initial dispensing occurs along all sides, an additional dispensing step can be included to build up the fillet to create a more reliable connection of the die to the substrate. For example, as represented in FIG. 8, one can dispense more material to build a fillet up to the level indicated by dashed lines 72. Any additional dispensing step can be performed without worry for the formation of voids, as there is no longer any potential for trapped air. Accordingly, the additional fillet dispense can likewise be performed around the entire perimeter in a very short time.

In another embodiment of the invention, allowing step 18 of process flow 10 is assisted by creating a low pressure area at the bottom surface of the wiring substrate, particularly near hole 39. The low pressure area is used to create a pressure differential from the top surface of the substrate to the bottom surface. The pressure differential is used to hasten the flow of underfill encapsulation material 52 toward hole 39. The pressure differential needed for highly fluid underfill encapsulation materials may be quite small (approximately 0 to 10 Torr). More viscous fluids may require a higher pressure differential. One method of creating the low pressure area is to supply a vacuum beneath the substrate. This can be accomplished by supporting the substrate on a pedestal which has an orifice which aligns with hole 39. A controllable vacuum source is supplied to the pedestal through use of a vacuum pump, a venturi or other means. In creating a low pressure area beneath the substrate in accordance with practicing the invention, one should avoid vacuum levels high enough to pull air through the advancing flow front, or to suck the underfill encapsulation material through hole 39. The vacuum should be applied when the underfill encapsulation material has been dispensed along the entire perimeter and the vacuum should be vented after the active or bumped surface of the die overlying hole 39 is covered with underfill encapsulation material 52.

Figures 9, 10:
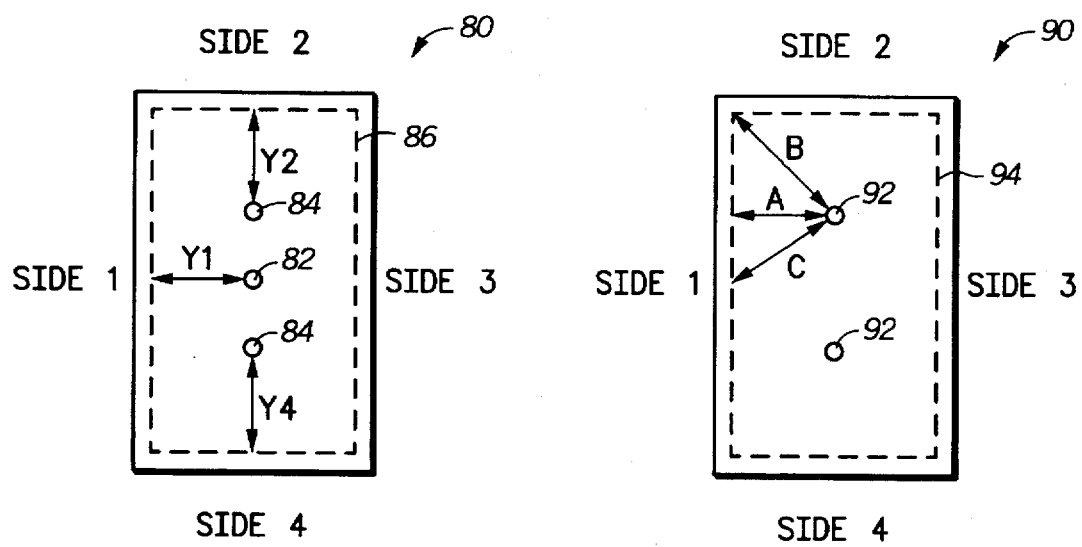
FIGS. 9 and 10 are top-down views of alternative wiring substrates which are suitable for practicing the present invention.

FIGS. 9 and 10 illustrate alternative designs for a wiring substrate which can be used in accordance with the present invention. As noted in reference to an earlier embodiment, a semiconductor die was preferably mounted to the substrate such that the hole in the wiring substrate corresponded to the center of the die. However, as the die shape becomes elongated (for example, in memory chips which typically include two short sides and two long sides) the use of a central, circular hole may not fulfill the objectives of the present invention. With a single, centrally located hole, the underfill encapsulation material flowing from the longer sides of the die will reach the opening prior to the underfill encapsulation material flowing from the short sides of the die. Thus, a central hole in the wiring substrate can be blocked off prior to the expulsion of all trapped air.

The potential voiding problem with non-equilateral die can be overcome in a couple of ways. As illustrated in FIG. 9, holes in addition to a centrally located hole can be included in the wiring substrate. For example, a wiring substrate 80 illustrated in FIG. 9 includes a central hole 82 and two additional holes 84 which are strategically located in the wiring substrate such that the distance from each side of the semiconductor die (wherein the die perimeter is represented in FIG. 9 by dashed line 86) to the nearest hole in the substrate, is approximately equal around the entire perimeter of the die. In other words, and as illustrated in FIG. 9, the distance (Y1) from a point along Side 1, the distance (Y2) from a point along Side 2, and the distance (Y4) from a point along Side 4 to the nearest hole in the wiring substrate is approximately equal. (Note that as illustrated, the point along the side chosen is the centerpoint of the side because this represents the shortest distance from the side to any hole). One potential problem with using multiple holes in the substrate is voiding of the underfill encapsulation material between holes 82 and 84. The flow front of the underfill encapsulation material could possibly reach and fill holes 82 and 84 before completely filling in the area between holes 82 and 84. Such voiding can best be prevented by positioning holes 84 in the substrate closer to center hole 82. In a preferred form to prevent inter-hole voiding, the location of holes 84 should be so positioned to result in the distance (Y2) or (Y4) being between 1 to 1.7 times distance (Y1) (i.e. approximately one-half the narrowest width of the die).

A second manner for addressing the potential problem of underfilling a die having unequal side lengths is to include more than one hole, none of which are located at the center of the die. This technique is illustrated in FIG. 10 in a wiring substrate 90 which includes two holes 92. The perimeter of a die to be mounted on wiring substrate 90 is represented in FIG. 10 by dashed line 94. As illustrated in FIG. 10, wiring substrate 90 does not have a hole which is located near the center of the die. Instead, holes 92 are positioned in the substrate such that a distance from any point along any side of the die to a nearest hole in the wiring substrate is less than twice as great as a shortest distance between any point along a side of the semiconductor die and its nearest hole. For example, distance A is the shortest distance from side one to either hole 92. The distance from any other point along side one to hole 92 is not more than 2A. Neither a distance B from a corner of the die along Side 1 to a hole 92, nor the distance C from a center point of Side 1 to a hole 92 is more than 2A. Preferably, distances A and B, or any point along a side to a nearest hole, should be no more than one and one-half times the shortest distance from the side to a hole in order to provide a uniform flow distance of the underfill encapsulation material from each side to an opening.

Another method of achieving void-free underfill encapsulation with elongated die is to utilize a hole shape which is also elongated. For example, with a die having two long sides and two short sides, a narrow, rectangular slot could be used as the hole in the substrate. To achieve void-free underfilling, the dimensions of the slot (length and width) can be chosen to be proportional to the die side dimensions (long side and short side).

Figure 11:
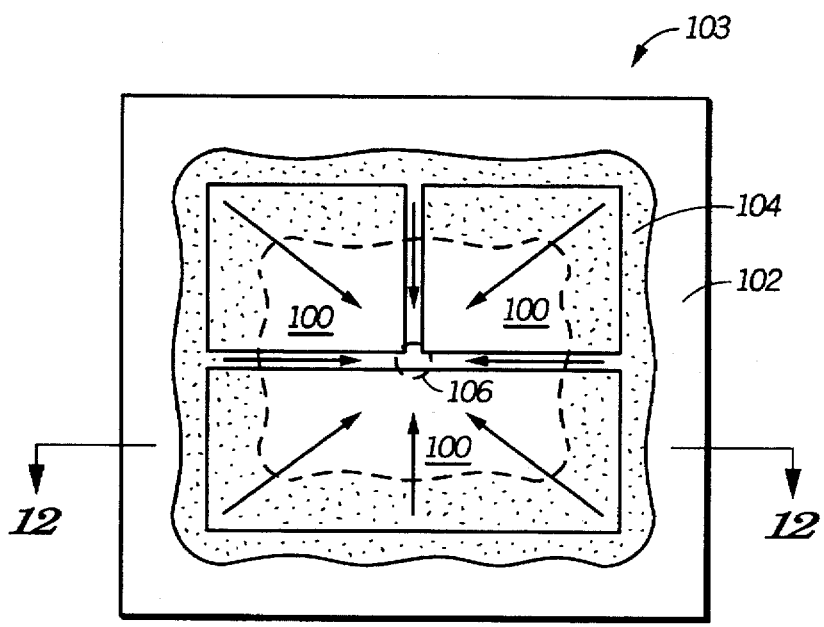
FIG. 11 is a top down view of an embodiment of the present invention for underfilling multiple flip-chip semiconductor die with a single dispensing operation, for example as used in a multichip module device.
Figure 12:
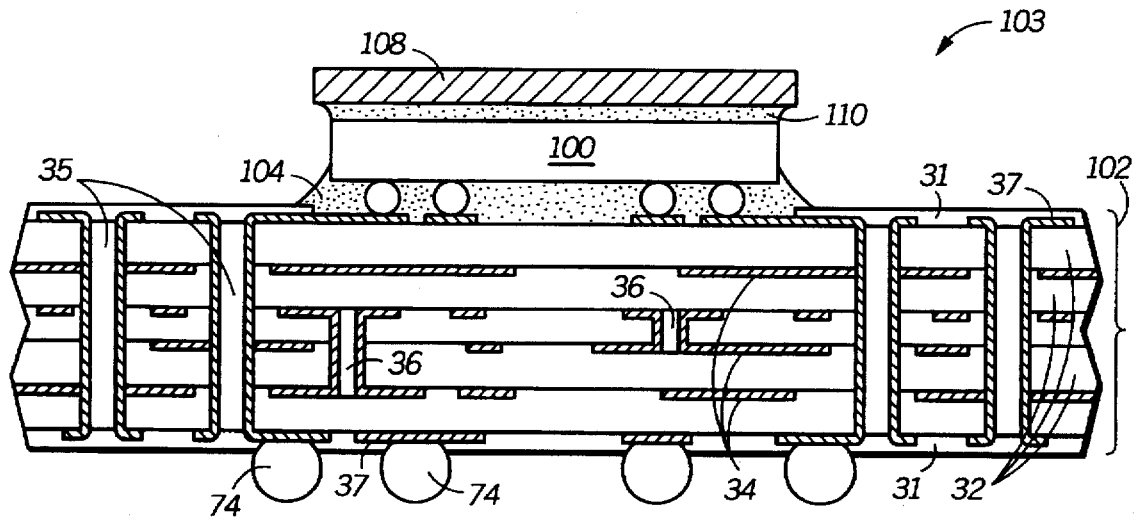
FIG. 12 is a cross-sectional illustration of the device of FIG. 11 demonstrating the use of a lid to assist the underfilling process.

In another embodiment of the present invention, perimeter dispense underfilling can be performed simultaneously around multiple flip-chip semiconductor die at one time. As illustrated from a top-view in FIG. 11, and in a cross-sectional view in FIG. 12, multiple semiconductor die 100 are flip-chip mounted on a wiring substrate 102 to form a flip-chip semiconductor device 103. In some multichip module applications, the die are so closely spaced together (<0.25 mm apart) that a dispensing needle cannot fit between the die to dispense an underfill encapsulation material around each die. In accordance with the present invention, one dispensing operation which dispenses an underfill encapsulation material around a perimeter of a group of die is performed. A lid 108 (not shown in FIG. 11), which preferably also serves as a heat spreading element, is attached to the backside or exposed side of the multiple die after flip-chip mounting is performed. Attachment of lid 108 can be accomplished through the use of an adhesive 110, such as a liquid dispensed adhesive or a tape-like adhesive. Edges of the lid or heat spreader should closely align with the edges of the die (e.g. within 0.25 mm of the die edges). An underfill encapsulation material 104 is then dispensed about the complete perimeter of the die array. The air displaced by the advancing underfill encapsulation material front vents from a hole 106 positioned essentially in the center of the die array region of the substrate. If the outer edge of the die array is not equilateral, then multiple holes or one or more slots can be formed in the substrate to allow uniform venting of the underfill encapsulation material and to eliminate voids. The purpose of attaching a lid or heat spreading element is to enclose the die array, so that upon dispensing the underfill encapsulation material the flow front follows in a direction toward the opening in the substrate.

The foregoing description and illustrations contained herein demonstrate many of the advantages associated with the present invention. In particular it has been revealed that the manufacturing time required to underfill a flip-chip semiconductor device can be significantly reduced in practicing the present invention. A four-sided dispense (or more generally an entire perimeter dispense) can be accomplished to reduce the amount of time it takes to underfill one or more die, while at the same time preventing the formation of voids. The presence of a hole in a wiring substrate is utilized to expel any trapped air which might exist as the underfill encapsulation material flows beneath the die, forcing any trapped air through the hole in the wiring substrate. The extent of the reduction in the manufacturing cycle time will be dependent upon various characteristics of the die and the underfill encapsulation material (for example, die dimensions, underfill encapsulation material viscosity, bump density, etc.). However, it has herein been demonstrated that a reduction of at least 4X has been achieved in one example. Another advantage in practicing the present invention is the fillet of the underfill encapsulation material is uniform after only one dispensing operation. Accordingly, additional dispensing steps on the same die can be eliminated, saving material costs and manufacturing time. Further advantages of the present invention include the fact that additional processing steps are not imposed in the assembly or mounting process of a flip-chip semiconductor die. Nor is the piece part cost of a wiring substrate significantly increased. In the case of organic substrates, holes must already be drilled through the substrate to form vias, and in the case of ceramic substrates holes are already either punched or drilled in the individual ceramic dielectric layers. Accordingly, additional processing of the wiring substrate is minimal as compared to conventional substrate manufacturing processes and costs.

Thus it is apparent that there has been provided in accordance with the invention, a method for underfilling a flip-chip semiconductor device and a device formed thereby that truly meets the need and advantages set forth previously. Although the invention has been described and illustrated with reference to specific embodiments, it is not intended that the invention be limited to these illustrative embodiments. Those skilled in the art will recognize that modifications and variations can be made without departing from the spirit of the invention. For example, the present invention is not limited to any particular number of holes which are formed in the wiring substrate. In addition, the invention is not limited to a particular underfill encapsulation material used. Nor is the invention limited to any particular shape of a die perimeter. It is also important to note that the present invention is not limited in any way to the type of conductive bumps that are used to make the flip-chip connections. Furthermore, this invention can be utilized for assembly of un-bumped die where the bumps are formed on the substrate rather than on the die. In addition, this invention is not limited to circular holes in the substrate. Any shaped hole or holes can be formed by punching, routing, drilling or other available means. Therefore, it is intended that this invention encompass all such variations and modifications as fall within the scope of the appended claims.

We claim:

1. A process for under filling a flip-chip semiconductor device:

providing a wiring substrate having a hole formed therethrough;

providing a semiconductor die having a plurality of bumps formed on an active surface thereof, a perimeter, and a center;

mounting the semiconductor die on the wiring substrate in a flip-chip configuration such that the active surface is adjacent the wiring substrate and the plurality of bumps are connected to the wiring substrate, wherein upon mounting the semiconductor die the hole of the wiring substrate is located near the center of the semiconductor die, and wherein upon mounting a space is created between the active surface of the semiconductor die and the wiring substrate; and dispensing an under fill encapsulation material around an entirety of the perimeter of the semiconductor die;

wherein after the step of dispensing, the underfill encapsulation material flows inward from the perimeter of the semiconductor die toward the hole in the wiring substrate, allowing air in the space between the semiconductor die and the wiring substrate to be expelled through the hole.

2. The process of claim 1 wherein the step of dispensing occurs within a short enough time period to prevent the underfill encapsulation material from reaching the hole before completion of the step of dispensing.

3. The process of claim 1 wherein the step of dispensing occurs within a short enough time period to cause a flow time of the underfill encapsulation material toward the center of the semiconductor die to be substantially equal around the perimeter of the semiconductor die.

4. The process of claim 1 wherein the step of providing a wiring substrate comprises providing a wiring substrate wherein the hole has a width of less than 2 millimeters.

5. The process of claim 4 wherein the step of providing a wiring substrate comprises providing a wiring substrate having a circular hole having a diameter of less than 1 millimeter.

6. The process of claim 1 further comprising the step of providing a low pressure area beneath the wiring substrate and near the hole to assist flow of the underfill encapsulation material toward the hole.

7. The process of claim 1 wherein the step of dispensing is accomplished in less than 0.60 seconds per millimeter of the perimeter of the semiconductor die.

8. A process for underfilling a flip-chip semiconductor device comprising the steps of:

providing a semiconductor die having four sides and a plurality of conductive bumps formed on an active surface thereof;

providing a wiring substrate having a hole formed therethrough and having a plurality of conductive pads around the hole and formed on a surface of the wiring substrate;

placing the semiconductor die on the wiring substrate such that the plurality of conductive bumps is in physical and electrical contact with the plurality of conductive pads and such that the hole underlies the semiconductor die;

providing a dispensing needle;

using the dispensing needle to dispense an underfill encapsulation material around the four sides of the semiconductor die; and allowing the underfill encapsulation material to flow between the semiconductor die and the wiring substrate toward the hole in the wiring substrate, after the underfill encapsulation material has been dispensed around all four sides of the semiconductor die, and without placing the semiconductor die and the wiring substrate in an enclosed vacuum chamber.

9. The process of claim 8 wherein the step of allowing is performed without any assistance by a vacuum.

10. The process of claim 8 wherein the step of providing a wiring substrate comprises providing a wiring substrate wherein the hole has a width of less than 2 millimeters.

11. The process of claim 8 wherein during the step of allowing the under fill encapsulation material flows at least partially into the hole in the wiring substrate.

12. The process of claim 8 wherein the step of using comprises using the dispensing needle to dispense an under fill encapsulation material around the four sides of the semiconductor die in under 0.60 seconds per millimeter of die perimeter.

13. The process of claim 8 wherein the step of providing a wiring substrate comprises providing a wiring substrate having a plurality of holes, and wherein the step of placing comprises placing the semiconductor die on the wiring substrate such that the semiconductor die overlies the plurality of holes.

14. The process of claim 13 wherein the step of placing comprises placing the semiconductor die on the wiring substrate such that a distance from any point along any side of the semiconductor die to a nearest hole is less than twice as great as a shortest distance between a point along a side of the semiconductor die and a hole.

15. A process for underfilling a flip chip semiconductor device comprising the steps of:

providing a substrate having a hole formed therethrough;

providing a plurality of semiconductor die;

mounting the plurality of semiconductor die on the substrate to form a die array having a perimeter, wherein the hole of the substrate is located within the perimeter of the die array;

dispensing an underfill encapsulation material around the perimeter of the die array; and allowing the underfill encapsulation material to underfill each die of the plurality of semiconductor die while pushing any air trapped beneath the plurality of semiconductor die out through the hole.

16. The process of claim 15 further comprising the step of placing a lid over the plurality of semiconductor die prior to the step of dispensing.

17. The process of claim 15 wherein the step of mounting comprises mounting the plurality of semiconductor die on the substrate such that a space between two adjacent semiconductor die is less than 0.25 millimeters wide.

* * * * *